United States Patent
Kondratiev

(10) Patent No.: US 7,250,832 B2
(45) Date of Patent: Jul. 31, 2007

(54) METHOD FOR REALIZING SURFACE ACOUSTIC WAVE FILTER ARRANGEMENTS AND FILTER ARRANGEMENT OBTAINED IN ACCORDANCE TO THIS METHOD

(75) Inventor: Serguei Kondratiev, Neuchatel (CH)

(73) Assignee: TEMEX, Pont Sainte-Marie (FR)

( * ) Notice: Subject to any disclaimer, the term of this patent is extended or adjusted under 35 U.S.C. 154(b) by 0 days.

(21) Appl. No.: 10/499,589

(22) PCT Filed: Dec. 13, 2002

(86) PCT No.: PCT/IB02/05732

§ 371 (c)(1),
(2), (4) Date: Aug. 12, 2004

(87) PCT Pub. No.: WO03/055066

PCT Pub. Date: Jul. 3, 2003

(65) Prior Publication Data

US 2005/0110367 A1    May 26, 2005

(30) Foreign Application Priority Data

Dec. 21, 2001    (EP) ................... 01403348

(51) Int. Cl.
*H03H 9/00* (2006.01)
*H03H 9/42* (2006.01)

(52) U.S. Cl. ...................... 333/193; 333/195

(58) Field of Classification Search ................ 333/193, 333/194, 195, 196; 310/313 B
See application file for complete search history.

(56) References Cited

U.S. PATENT DOCUMENTS 4,999,535 A * 3/1991 Mariani et al. ......... 310/313 B
6,072,377 A * 6/2000 Tajima et al. ............... 333/154

FOREIGN PATENT DOCUMENTS

| EP | 0795958    | 9/1997 |
| EP | 1037385    | 9/2000 |
| JP | 06-152317  | 5/1994 |

* cited by examiner

*Primary Examiner*—Dean Takaoka
(74) *Attorney, Agent, or Firm*—Ladas & Parry LLP

(57) ABSTRACT

The invention relates to a method for realizing surface acoustic wave filter arrangements of the kind comprising a piezo-electric substrate and on said substrate metallic strip elements constituting impedance filter elements arranged in a network scheme. In such an arrangement by electrostatic interaction between the network elements is produced a parasitic resonance at a frequency different from the operational resonance frequency. The method is characterized in that means are provided in the filter arrangement which produce a shifting of the parasitic resonance frequency to a frequency substantially equal to said operational resonance frequency. The invention can be used for filter arrangements.

6 Claims, 4 Drawing Sheets

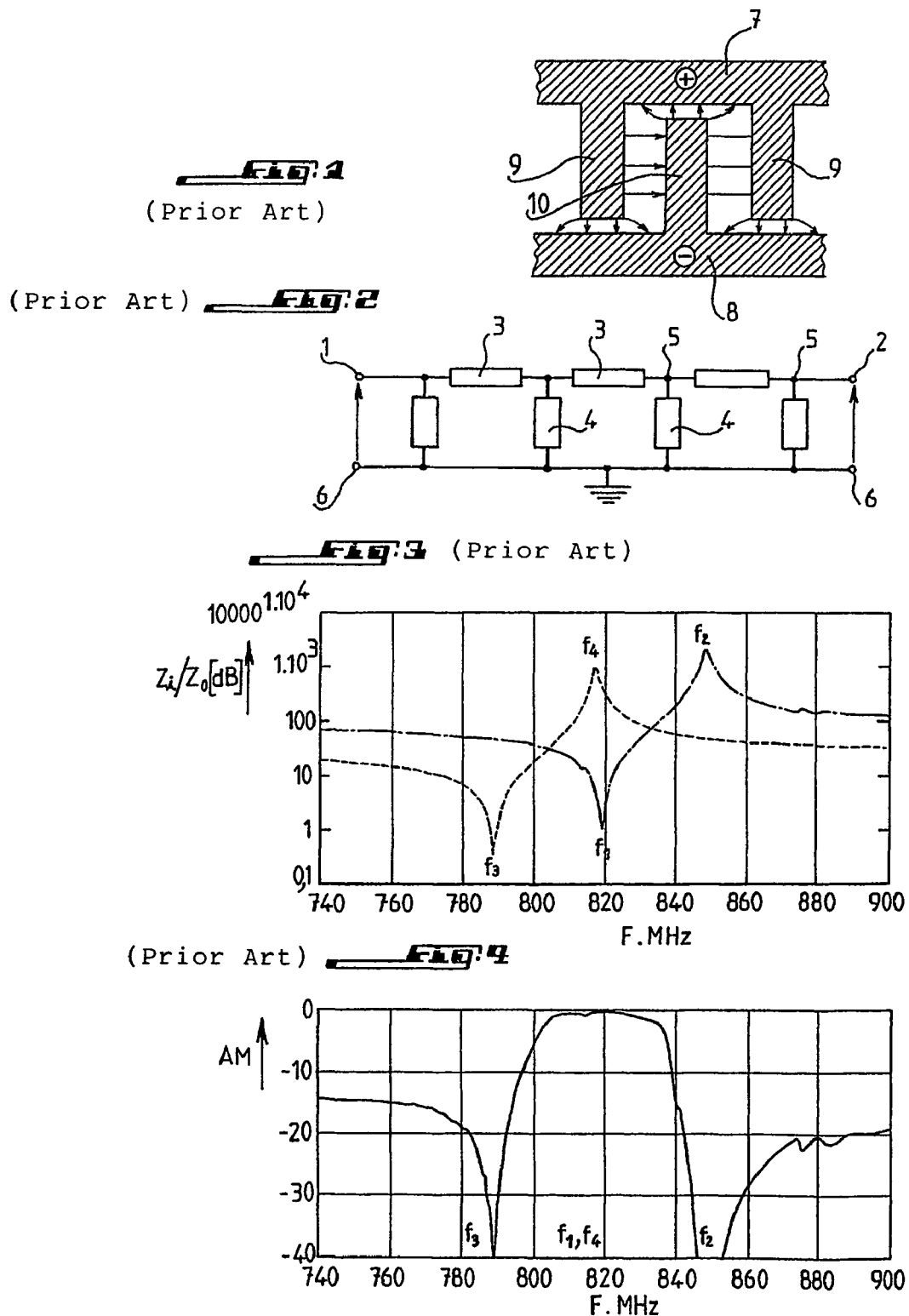

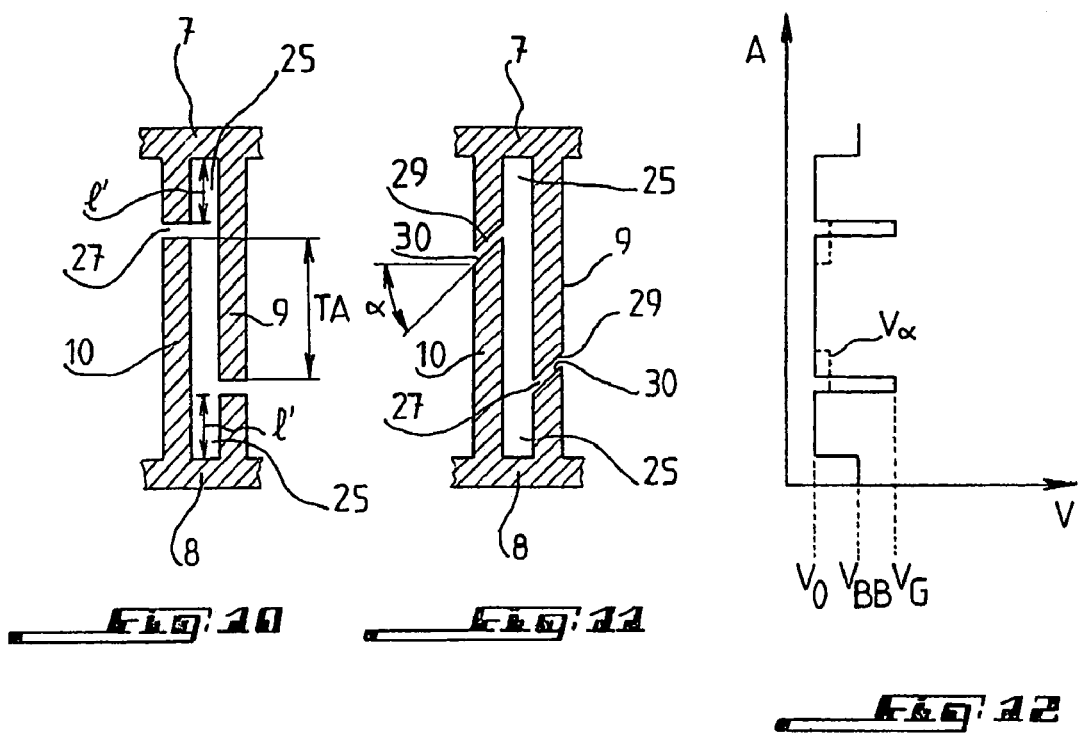
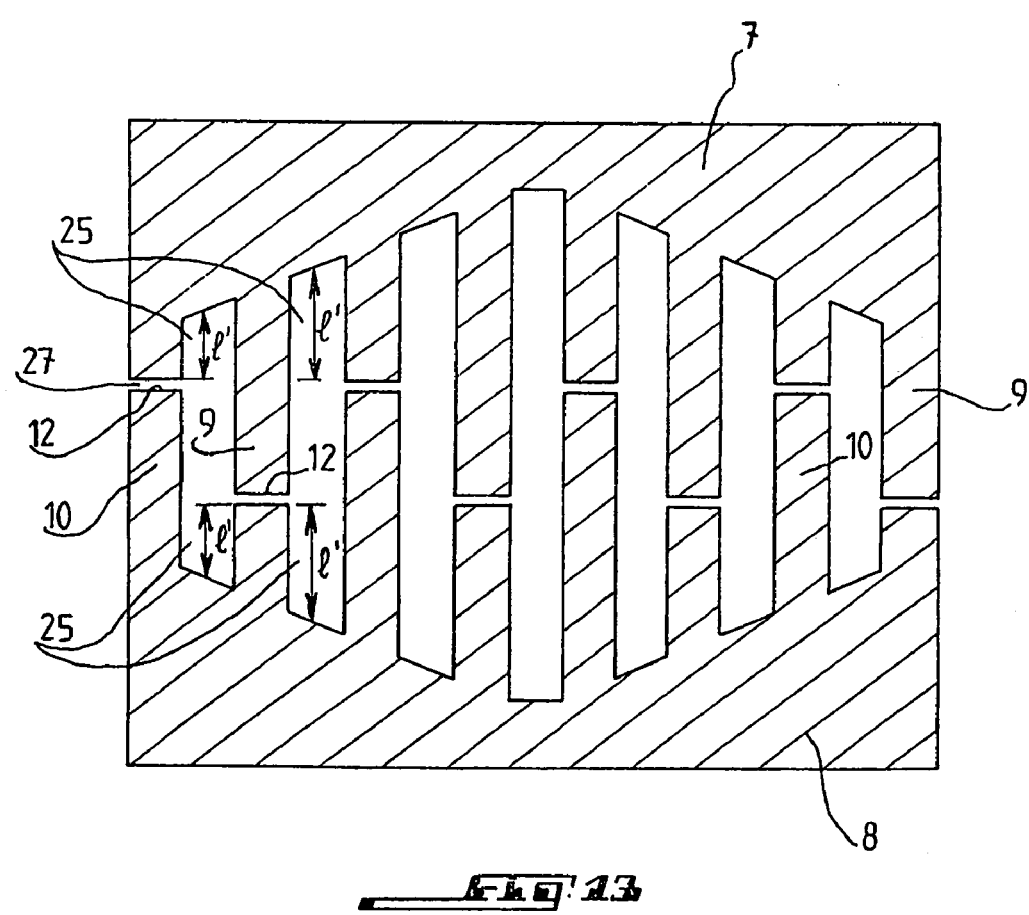

METHOD FOR REALIZING SURFACE ACOUSTIC WAVE FILTER ARRANGEMENTS AND FILTER ARRANGEMENT OBTAINED IN ACCORDANCE TO THIS METHOD

The invention relates to a method for realizing surface acoustic wave (SAW) filter arrangements, of the kind comprising a piezo-electric substrate and on said substrate metallic strip elements constituting impedance filter elements arranged in a network scheme and a surface acoustic wave filter arrangement obtained in accordance to this method.

BACKGROUND OF THE INVENTION

Surface acoustic wave filter arrangements of this kind are already known. The FIG. 1 shows a portion of such a network realized in the shape of a ladder network, the circuit diagram of which is shown on FIG. 2. On this figure, between an input terminal 1 and an output terminal 2 a plurality of seriesly connected impedance elements 3 are shown with a parallel impedance element 4 between respectively the input terminal 1, the output terminal 2 and the nodes 5 between two adjacent series impedance elements 3 on the one hand, and the ground 6 on the other hand. On the FIG. 1, the series impedance elements 3 are realized as upper and lower metallic strips forming bus-bars 7, 8 deposited on a piezoelectric substrate (not shown). The parallel impedance elements 4 are realized as inter-digital electrodes 9, 10 extending perpendicularly respectively from the upper bus-bar 7 and the lower bus-bar 8.

The FIGS. 3 and 4 illustrate the electrical behaviour of a ladder network in accordance to the FIGS. 1 and 2. FIG. 3 shows the simulated impedance performance Zi/Zo of impedance elements 3 and 4, Zi and Zo being the input and output impedances. The first impedance element 3 has a low impedance of for instance 1 Ohm, at a resonance frequency $f_1$ and a high impedance of for instance 1000 Ohms, at an anti-resonance frequency $f_2$. The second impedance element is shifted in frequency so that the resonance frequency $f_1$ of the series impedance element 3 and the anti-resonance frequency $f_4$ of the parallel impedance element 4 were about the same.

The simulation of this impedance element arrangement yields the electrical bandpass filter performance such as shown on FIG. 4 for a Γ-type scheme with a passband around $f_1$ and $f_4$ and deep notches at $f_2$ and $f_3$. This figure shows the dependency of the amplitude AM in dB from the frequency f in MHz.

In practice the real impedance performance differs from the illustrated simulated performance, particularly due to parasitic effects. One of these is caused by the electrostatic interaction between the bus-bars 7 and 8 and the edges 12 of the inter-digital electrodes 9 and 10. This electrostatic interaction creates a periodic charge and electric field distribution in the bus-bar area 13 adjacent the corresponding inter-digital electrodes edge 12 and in the gap 14 with the same periodicity as for inter-digital electrodes 9, 10. On the FIG. 4 the electric field distribution is illustrated by arrows. Both the gap electrical field and the bus-bar charge distribution create a parasitic acoustic resonance on a higher frequency, the frequency shift and the amplitude of which depend on substrate material, metal thickness, mark-to-period ratio and is usually in a range of 0.01 to 1% for the frequency shift and in a range of 0.1 to 10% for the amplitude. Due to this parasitic interaction the real passband of an impedance element filter is narrower than the simulation made without taking into account the parasitic interaction.

The FIG. 5 illustrates the frequency response FR of a 947.5 MHz surface acoustic wave filter whereon the dashed line indicates measured values and the solid line the simulated filter response. It is to be noted that the 3 dB level L of the measured curve has a width of 5 MHz less than the simulated curve, on the lower frequency side of the centre frequency. In the filter which has been used the parallel impedance elements 4 were about four times longer than the length of the elements 3. When the length of the series impedance elements 3 is greater than the length of the parallel elements 4, the main difference between the measured and the simulated curve is on the side of the higher frequencies with respect to the centre frequency of the passband.

A second parasitic effect resides in the wave-guide mode excitation.

BRIEF SUMMARY OF THE INVENTION

The main object of the invention is to propose a surface acoustic wave filter which does not have the inconveniences which have been described for the known-filter arrangements.

For reaching this object the method for realizing a surface acoustic wave filter arrangement according to the invention is characterized in that means are provided for shifting the parasitic resonance created by electrostatic interaction between the inter-digital electrodes and the bus-bars to a frequency substantially equal to the frequency of the operational resonance of the filter arrangement.

The surface acoustic wave filter arrangement for putting into practice this method is characterized in that for obtaining said parasitic resonance frequency shift, additional cut outs are provided in the bus-bar areas adjacent to the ends of the inter-digital electrodes at periodically succeeding locations in the longitudinal axis of these bus-bars.

BRIEF DESCRIPTION OF THE DRAWINGS

The invention will be explained in a more detailed manner with further objects and advantages in the following description referring to the annexed figures where FIG. 1 shows a portion of a known surface acoustic wave filter arrangement having an inter-digital structure;

FIG. 2 illustrates the circuit diagram of an inter-digital surface acoustic wave filter arrangement in accordance to the FIG. 1;

FIG. 3 is a diagram showing the impedance performances of the arrangement shown on FIG. 2;

FIG. 4 is a diagram showing an amplitude performance of the Γ-type ladder network of FIG. 2;

FIG. 10 is a schematic drawing of an inter-digital structure surface acoustic wave filter arrangement with dummy electrodes;

FIG. 11 is a schematic drawing of an inter-digital structure surface acoustic wave filter arrangement with dummy electrodes in accordance to the invention;

FIG. 12 is a diagram showing the surface acoustic wave velocity distribution across the aperture of the filter arrangement according to FIGS. 10 and 11;

FIG. 13 is a schematic drawing of another embodiment of a inter-digital structure surface acoustic wave filter arrangement with dummy electrodes.

DETAILED DESCRIPTION OF THE INVENTION

The invention is based upon the discovery that the inconvenience of the parasitic effects due to the electrostatic interaction between the bus-bars 7, 8 and the edges 12 of the inter-digital electrodes 9, 10 in an inter-digital structure surface acoustic wave filter arrangement such as shown on FIG. 1 can be eliminated by providing means in such a standard filter arrangement, producing a frequency shift of the parasitic resonance to a frequency substantially equal to the operational resonance frequency of the inter-digital structure and decreasing the influence of parasitic responses.

Figure 5:
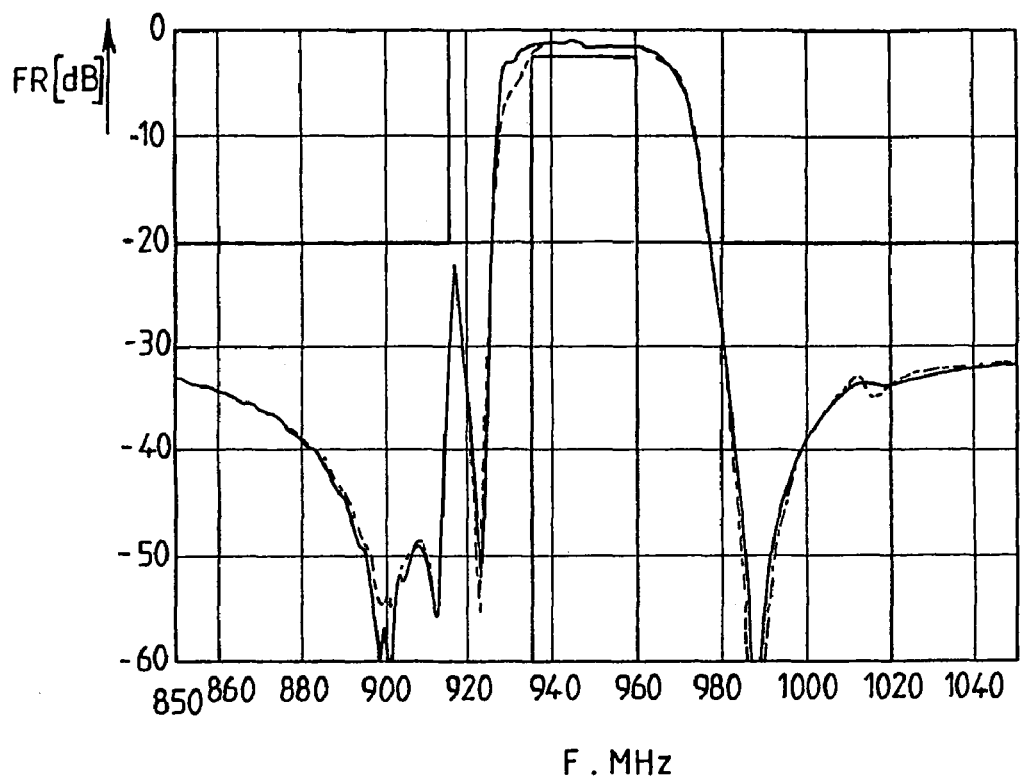
FIG. 5 illustrates the amplitude performance of a 947.5 MHz surface acoustic wave filter arrangement showing by a dot line the measured amplitude performance and by a solid line curve the simulated amplitude performance.
Figure 6:
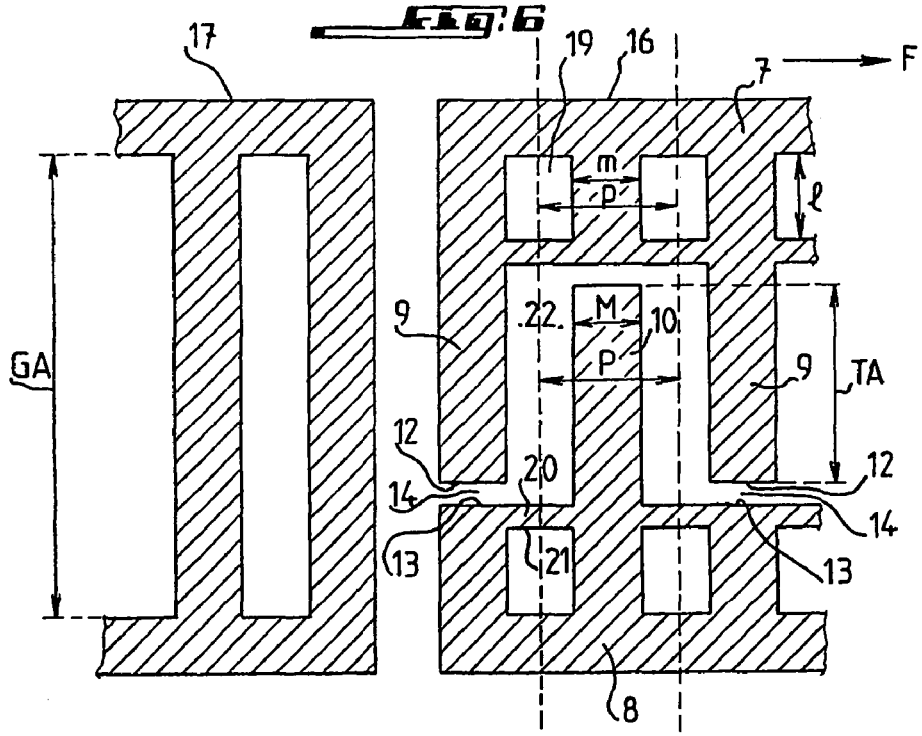
FIG. 6 is a schematic diagram of a portion of a surface acoustic wave filter arrangement in accordance to the invention.

The FIG. 6 shows an inter-digital structure surface acoustic wave (SAW) filter arrangement proposed to this purpose by the invention. On this figure the reference 16 indicates an inter-digital surface acoustic wave filter structure portion constituting the transducer part of the filter arrangement, to which is associated a reflector input portion 17 in a non per se manner.

In accordance to the invention, the means for shifting the parasitic resonance in the way to coincide with the operational resonance frequency of inter-digital structure portion 16, i.e. for synchronising both resonances, reside in providing holes 19 in the upper and lower bus-bars 7 and 8. For having the best synchronisation of both resonances, the holes 19 have the shown rectangular shape. The holes period p, i.e. the distance between two vertical centre lines of two successive holes in the direction of the SAW propagation should be substantially equal to the inter-digital electrode pitch P. The mark to period ratio of the inter-digital electrodes M/P should be substantially the same as the mark to period ratio m/p of the holes, where M is the width of an interdigital electrode 9, 10 and m the distance between two adjacent holes.

In this case, the bus-bar holes 19 create a periodic grating which increases the effective coefficient of reflection of the impedance elements and, accordingly, the quality (Q) factor of these elements is heigher, because the SAW energie propagates not only in the transducer aperture area TA defined by the overlap distance of adjacent inter-digital electrodes 9, and 10 such as shown on FIG. 6.

When, in accordance with the invention, the centre frequencies of both the parasitic resonance and the operational resonance are substantially the same, the total impedance has the requested form which does not change the impedance element filter performance. It takes into account only that the effective aperture is a little higher than the real overlap TA of the electrodes. Obviously, to achieve the best results, the bus-bar to electrode edge gap 14 and the separation 20 between a bus-bar edge 13 and the adjacent hole edge 21 should be as less as possible.

Furthermore, for the best synchronisation of both resonances, the centre of the distance between two adjacent holes 19 for both bus-bars 7, 8 should be substantially on line with the centre of the inter-digital electrodes. In this case, the phase of the reflected surface acoustic waves in the inter-digital electrodes and in the additional grating created by the holes 19 are the same.

The advantage of this feature is in a reduction of resistance of the electrodes of the impedance elements. It has been found that the passband varies in function of the length l of the holes in the direction perpendicular to the SAW propagation.

Figure 8:
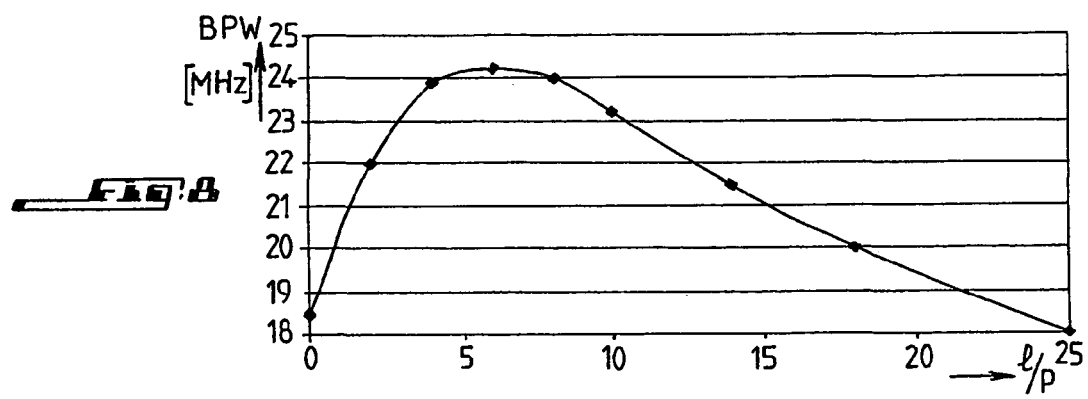
FIG. 8 is a plot of the passband of a 860 MHz inter-digital surface acoustic wave filter arrangement in accordance to the invention, as function of holes length.

The FIG. 8 illustrates this dependency, the bandpass width at the level of 2.5 dB in MHz being indicated on the ordinate whilst the length defined by the ratio l/P is indicated on the abscisse, P being the inter-edge electrode pitch (FIG. 6). The FIG. 8 shows the result of the passband measurements for 860 MHz realized on a 42° Lithium Tantalat substrate. It follows from the shown plot that the holes 19 are most efficient when their length l is in the range of 4 to 7 P. Using holes having a length greater than 20 P is not effective due to the increase in size and additional insertion loss associated with high electrode resistance. Using the smallest holes at a length l less than 0.4 P is also not effective.

Figure 9:
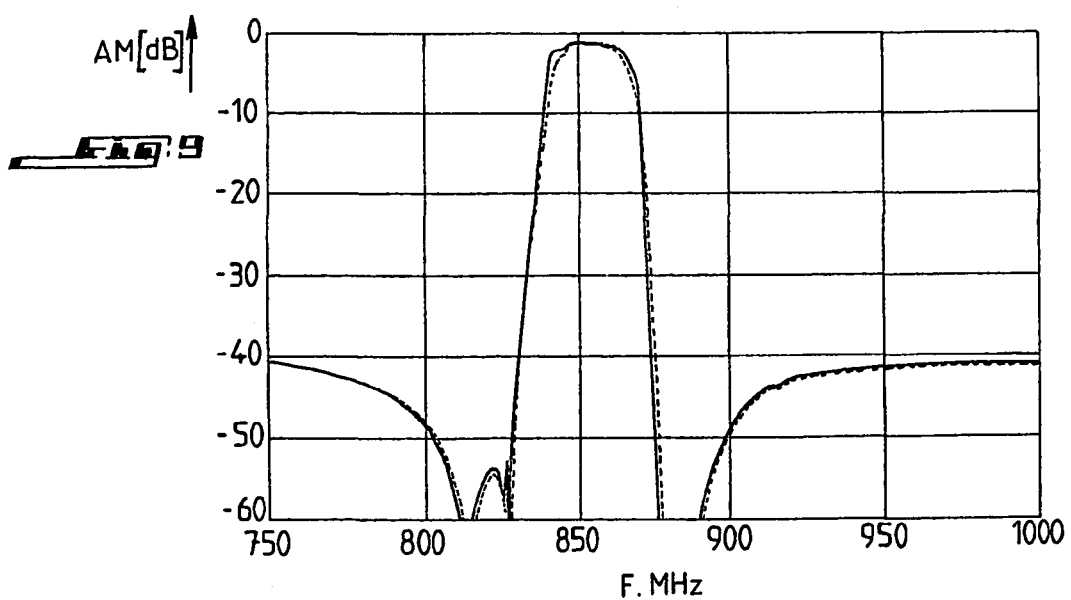
FIG. 9 is a diagram showing by a dot line curve the amplitude performance of a standard 860 MHz surface acoustic wave filter arrangement and by a solid line curve the amplitude performance of a corresponding filter arrangement according to the invention.

FIG. 9 shows the measured performances of a SAW filter arrangement with additional holes 19 in accordance to the invention and the performances of a standard filter arrangement. The performances of the filter arrangement according to the invention are shown by a solid line curve, the length l of the holes having the value 7 P. The standard filter performance is shown by the dot line curve. It results from a comparison of both curves, that the invention provides a better shape factor design because the passband is wider in comparison to the standard filter curve, the outband rejection being the same.

Figure 7:
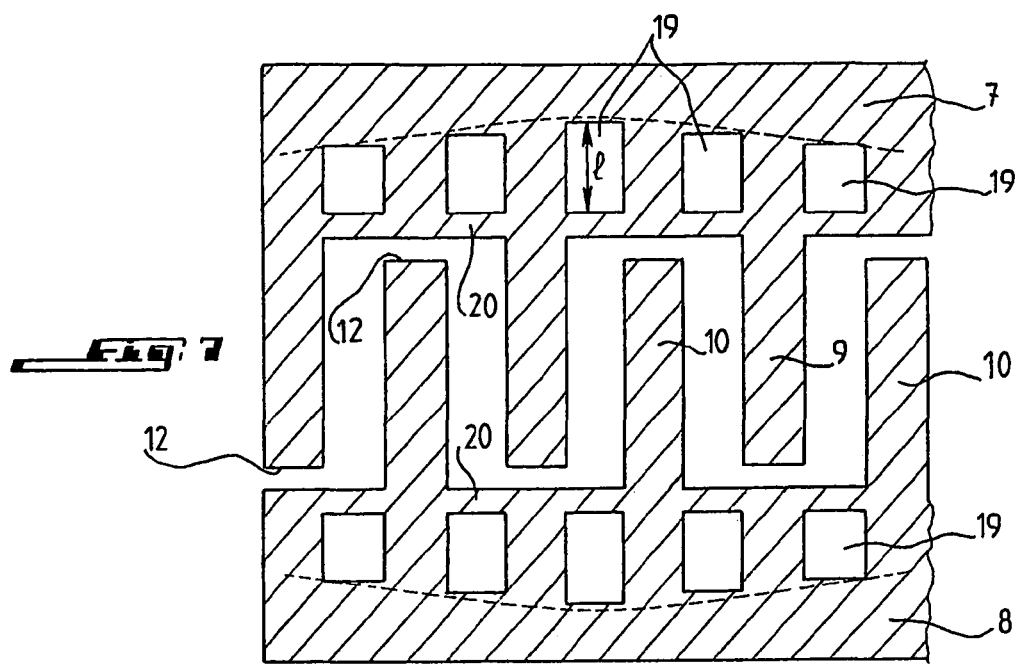
FIG. 7 is a schematic diagram of another embodiment of a portion of an inter-digital surface acoustic wave filter arrangement in accordance to the invention.

The FIG. 7 illustrates an embodiment of an inter-digital surface acoustic wave (SAW) filter arrangement according to the invention wherein the length l of the holes 19 is variable. Due to the variation of the whole length, the parasitic response due to parasitic wave guide modes can be decreased. The lower sensitivity to parasitic wave guide responses is known in the field of SAW filters for apodized transducers having inter-digital electrodes with variable length. The invention differs therefrom by the fact that the proposed structure has unapodized inter-digital electrodes with a constant overlap but wherein the hole length l, i.e. the passive part of the transducer, is variable. The variation of the hole length can be made in the way to have the shown smooth shape with an increasing and then decreasing length in the direction of the propagation of the waves. A smooth variation shape similar to $\cos(x)^n$ is preferable with n=1, 2, 3 . . . , and x in the range from $-\pi/2$ to $+\pi/2$.

In the foregoing it has been written that to achieve best results in synchronising the parasitic resonance and the operational resonance of the inter-digital structure the bus-bar to electrode edge gap 14 and the separation 20 between a hole edge 20 and the corresponding bus-bar edge 13 (FIG. 6) should be as less as possible. When making the separation 20 zero, a dummi finger inter-digital structure is obtained such as illustrated on FIGS. 10 and 11 with a constant overlap or transducer aperture TA, the inter-digital space portion 25 formed by the holes 19 with the separation 20 having become 0 constituting the passive part of the transducer.

On the FIGS. 10 and 11 the portion 25 has a constant length. In the embodiment shown on FIG. 13, the length l' of the portion 25 varies in the wave propagation direction according to a smooth shape preferably similar to $\cos(x)^n$ where $n=1, 2, 3 \ldots$, and x in the range of $-90/2, +\pi/2$.

In the dummi finger structures shown on FIGS. 10 and 11 created by holes with the separation 20 having become 0 the electrode gap 27 is less than the electrode width. The minimum gap size is limited by process and DC voltage and RF power requirements. When the gap area is smaller, the amplitude of parasitic response is smaller too.

In the dummi electrode structure case illustrated on FIG. 11, the inter-digital electrode edges 29, 30 form an angle α with the edges of the bus-bars which is in the range of 0 to 60°. This configuration has the advantages of reduction of the transition area and the synchronization of resonances, which are explained by the FIG. 12 showing the surface acoustic wave velocity distribution V across the aperture direction A. The smallest phase velocity $V_0$ corresponds to the inter-digital area, the highest velocity $V_G$ to the free surface area, the phase velocity on the bus-bar area $V_{BB}$ being therebetween. In the case of the angled gap shown on FIG. 11, the phase velocity $V_\alpha$ is, in comparison to the velocity $V_G$ relatively small so that the velocity variation across the aperture is very small.

It is furthermore to be noted, with reference to the FIG. 6, that the total grating aperture GA is overlapping the inter-digital electrode and holes apertures. Due to this fact, the effective coefficient of reflection of the impedance elements and, as results, the Q-factor of the impedance elements is higher because more SAW energie comes back in the inter-digital structure.

It is furthermore to be noted that the best synchronisation of the parasitic and operational resonances can be obtained with a SAW impedance element filter arrangement having additional sub-layers on the surface of the bus-bars adjacent to the inter-digital structure which creates the same SAW velocity as in the inter-digital structure.

It is obvious that the invention is not restricted to the filter arrangements which have been described and illustrated for example purposes only but relates to all filter arrangements where similar parasitic resonance phenomena are produced.

The invention claimed is:

1. A surface acoustic wave filter comprising:
   bus-bars extending in the direction of propagation of surface acoustic waves and inter-digital electrodes extending perpendicularly from said bus-bars, said electrodes being spaced apart by an inter-digital electrode pitch P, said bus bars further having parasitic resonance frequency shifting cut outs formed therein, said cut outs in the bus bars being spaced apart by said inter-digital electrode pitch P in a parallel relationship to the direction of the surface acoustic wave propagation;
   wherein the cut outs create a dummi finger structure with electrode to electrode gaps less than an inter-digital electrode width M.

2. The surface acoustic wave filter of claim 1 wherein center lines of the cut outs in the upper and lower bus-bars align with center lines between two adjacent inter-digital electrodes.

3. The surface acoustic wave filter of claim 1 wherein the length of the cut outs in the direction perpendicular to the surface acoustic wave propagation direction is rn the range of 0.4 to 20 times the inter-digital electrode pitch P.

4. The surface acoustic wave filter of claim 1 wherein the length of the cut outs in the direction perpendicular to the surface acoustic wave propagation is variable.

5. The surface acoustic wave filter of claim 1, wherein the edges forming said gap and the surface acoustic wave propagation direction form an angle in the range of 0 to 60°.

6. The surface acoustic wave filter of claim 1, wherein the inter-digital electrodes have a mark to period ratio M/P substantially equal to a mark to period ratio m/p of the cut outs.

* * * * *